(12) United States Patent
Park et al.

(10) Patent No.: US 8,594,823 B2
(45) Date of Patent: Nov. 26, 2013

(54) SCANNER PERFORMANCE COMPARISON AND MATCHING USING DESIGN AND DEFECT DATA

(75) Inventors: Allen Park, San Jose, CA (US); Ellis Chang, Saratoga, CA (US); Masami Aoki, Kanagawa (JP); Chris Chih-Chien Young, Palo Alto, CA (US); Martin Plihal, Pleasanton, CA (US); Michael John Van Riet, Sunnyvale, CA (US)

(73) Assignee: KLA—Tencor Corporation, Milpitas, CA (US)

( * ) Notice: Subject to any disclaimer, the term of this patent is extended or adjusted under 35 U.S.C. 154(b) by 464 days.

(21) Appl. No.: 12/919,757

(22) PCT Filed: Jul. 12, 2010

(86) PCT No.: PCT/US2010/041697
§ 371 (c)(1),
(2), (4) Date: Aug. 26, 2010

(87) PCT Pub. No.: WO2011/008688
PCT Pub. Date: Jan. 20, 2011

(65) Prior Publication Data
US 2011/0172804 A1  Jul. 14, 2011

Related U.S. Application Data

(60) Provisional application No. 61/226,654, filed on Jul. 17, 2009.

(51) Int. Cl.
*G06F 19/00* (2011.01)
*H01L 21/66* (2006.01)

(52) U.S. Cl.
CPC ...................... *H01L 22/12* (2013.01)

USPC .......................................... 700/110; 700/121

(58) Field of Classification Search
CPC .............................. H01L 22/12; H01L 22/14
USPC ................................................ 700/110, 121
See application file for complete search history.

(56) References Cited

U.S. PATENT DOCUMENTS

| | | | |
|---|---|---|---|
| 8,038,897 B2 * | 10/2011 | Hung et al. ..................... 216/59 |
| 2002/0065616 A1 | 5/2002 | Leng | |
| 2003/0223630 A1 * | 12/2003 | Adel et al. .................... 382/145 |
| 2006/0155410 A1 | 7/2006 | Yamartino | |
| 2007/0156379 A1 * | 7/2007 | Kulkarni et al. ............... 703/14 |
| 2007/0288219 A1 * | 12/2007 | Zafar et al. ..................... 703/14 |
| 2008/0163140 A1 * | 7/2008 | Fouquet et al. .................. 716/4 |
| 2009/0030632 A1 | 1/2009 | Tallavarjula et al. | |

FOREIGN PATENT DOCUMENTS

KR    1020090041137 A    4/2009

* cited by examiner

*Primary Examiner* — Dave Robertson
(74) *Attorney, Agent, or Firm* — Bever, Hoffman & Harms, LLP; Jeanette S. Harms

(57) ABSTRACT

A system and method of matching multiple scanners using design and defect data are described. A golden wafer is processed using a golden tool. A second wafer is processed using a second tool. Both tools provide focus/exposure modulation. Wafer-level spatial signatures of critical structures for both wafers can be compared to evaluate the behavior of the scanners. Critical structures can be identified by binning defects on the golden wafer having similar patterns. In one embodiment, the signatures must match within a certain percentage or the second tool is characterized as a "no match". Reticles can be compared in a similar manner, wherein the golden and second wafers are processed using a golden reticle and a second reticle, respectively.

12 Claims, 8 Drawing Sheets

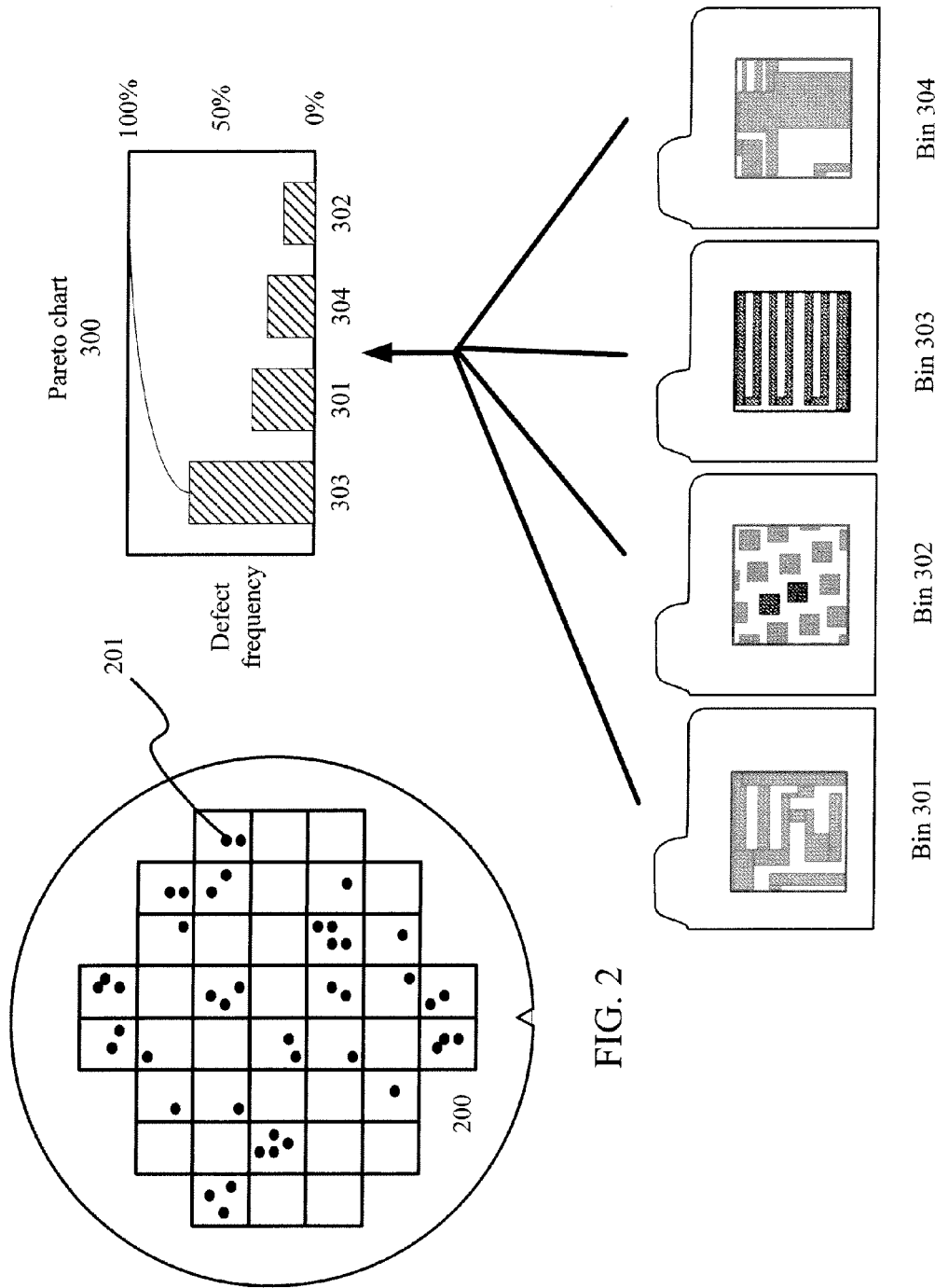

SCANNER PERFORMANCE COMPARISON AND MATCHING USING DESIGN AND DEFECT DATA

RELATED APPLICATIONS

This application claims priority of U.S. Provisional Patent Application 61/226,654, entitled "Scanner Performance Comparison And Matching Using Design And Defect Data" filed Jul. 17, 2009 and PCT Application PCT/US10/41697, entitled "Scanner Performance Comparison And Matching Using Design And Defect Data" filed Jul. 12, 2010.

BACKGROUND OF THE INVENTION

1. Field of the Invention

The present invention relates to scanner performance comparison and matching methods and systems using design and defect data. More particularly, this invention relates to a method of matching multiple scanners using design layout and defect inspection data in a production environment to ensure process windows are equalized across various scanners, thereby providing consistency across multiple scanners and platforms in the printability of critical structures in semiconductor devices.

2. Related Art

In a production environment, matching performance among various scanners is important to operate in similar process window to ensure repeated, accurate printability of structures on semiconductor wafers. Conventionally, critical dimension (CD) metrology of such wafers was used to identify process window across multiple tools. CD metrology can be used to measure variations in the lines and/or spaces of structures on the wafers; however, not all problems associated with various patterns on a semiconductor wafer may be addressed in this manner.

For example, standard CD metrology uses limited, fixed sampling sites. As a result, the sampling sites may not be sensitive to subtle variations in the process interaction, across reticle or wafer. Furthermore, the sampling sites may not represent the most critical structures in a given device. Thus, when the CD varies in the areas where the fixed sampling does not cover, an important excursion will be missed. An analysis of important excursions is critical for 45 nm and beyond process development. Because of the limited, fixed site sampling, scanning coverage of defect inspection may be necessary to provide an additional, complementary approach, thereby allowing an accurate assessment of scanner process window consistency.

Generally, a semiconductor manufacturing tool, e.g. an exposure tool or a stepper, performs a set of processing steps on a lot of wafers. To perform these steps, the manufacturing tool communicates with a manufacturing framework or a network of processing modules via an equipment/machine interface. Typically, the equipment/machine interface can form part of an advanced process control (APC) system. The APC system initiates a control script based upon a manufacturing model, which can be a software program that automatically retrieves the data needed to execute a manufacturing process.

Wafers are typically staged through multiple manufacturing tools for multiple processes to generate data relating to the quality of the processed semiconductor devices. Unfortunately, errors occurring during the processing of these wafers, namely process variations, can cause significant inconsistencies in the CDs of features on the processed semiconductor devices. CD variations can cause malfunctioning or even failure of associated devices when in use. Thus, fine tuning the performance of the manufacturing tools is important in obtaining accurate manufacturing data, which in turn can be used to adjust settings of subsequent manufacturing processes to decrease CD variations.

SUMMARY OF THE INVENTION

Successful matching scanners in a production environment can ensure repeated, accurate printability of structures on semiconductor wafers. An improved method for comparing scanners using design layout and defect data is provided. In this method, a golden wafer can be processed using a golden tool (e.g. a pre-qualified scanner). This processing includes focus and exposure modulation. Defects on the golden wafer can be identified using design data. Defects having similar patterns can be binned together. Critical structures can be identified by reviewing the binned defects. In one embodiment, identifying the critical structures can include a user review of SEM (scanning electron microscope) images of the defects. Wafer-level spatial signatures of the identified critical structures can be generated. The wafer-level spatial signature can include numerical, radial, quadrant, and/or specialized signatures. The numerical signature can be a metric showing pattern deviation from either the nominal or intended shape of a pattern from a design. The wafer-level spatial signatures and specific structure patterns can be stored in a pattern library.

The method can further include processing a second wafer using a second tool. Once again, defects on the second wafer can be identified using the design data. Wafer-level spatial signatures of the second wafer can be generated using the identified critical structures. At this point, the wafer-level spatial signatures of the golden wafer and the second wafer can be compared to determine whether the second tool matches the golden tool. In one embodiment, the signatures must match within a certain percentage or the second tool is characterized as a "no match". In one embodiment, the second tool is actually the golden tool at a later point in time, thereby allowing monitoring of the golden tool or any tool to itself.

A system for comparing scanners is also provided. This system can include a golden tool processor to process a golden wafer using a golden tool. Note that the golden tool processor controls modulating exposure and focus on the golden wafer. A binning generator can receive defect data of the golden wafer and group defects into bins based on patterns. A first spatial signature generator can generate wafer-level spatial signatures of critical structures on the golden wafer. These critical structures are identified using the patterns. A secondary tool processor in the system can process a second wafer using a secondary tool. The secondary tool processor controls modulating exposure and focus similarly to the golden tool processor. A second spatial signature generator can receive defect data of the second wafer and generate wafer-level spatial signatures of the second wafer using the critical structures. A comparator can advantageously compare the wafer-level spatial signatures of the golden wafer and the second wafer.

In one embodiment, the first spatial signature generator can receive SEM images of selected defects. The selected defects can be automatically selected based on a marginality of predetermined structures under various focus and exposure conditions. In one embodiment, the first and/or second spatial signature generators can generate spatial signatures that can be radial, quadrant, and/or specialized signatures.

A method for comparing reticles is also provided. In this method, a golden wafer can be processed using a golden reticle (e.g. a pre-qualified reticle). This processing includes focus and exposure modulation. Defects on the golden wafer can be identified using design data. Defects having similar patterns can be binned together. Critical structures can be identified by reviewing the binned defects. In one embodiment, identifying the critical structures can include a user review of SEM (scanning electron microscope) images of the defects. Wafer-level spatial signatures of the identified critical structures can be generated. The wafer-level spatial signature can include radial, quadrant, and/or specialized signatures. The wafer-level spatial signatures can be stored in a pattern library.

The method can further include processing a second wafer using a second reticle. Once again, defects on the second wafer can be identified using the design data. Wafer-level spatial signatures of the second wafer can be generated using the identified critical structures. At this point, the wafer-level spatial signatures of the golden wafer and the second wafer can be compared to determine whether the second reticle matches the golden reticle. In one embodiment, the signatures must match within certain percentage or the second reticle is characterized as a "no match".

A method for automatically estimating a process window of a reticle is also provided. In this method, defects on the wafer formed by the reticle can be identified. Defects having similar patterns can be binned together. Critical structures can be identified by reviewing binned defects. Wafer-level spatial signatures of identified critical structures can be generated. At this point, clean areas, dirty areas, and transition areas on the wafer can be identified based on the wafer-level spatial signatures. Advantageously, an outer limit of the process window can now be defined, wherein the outer limit is within the transition area(s).

In one embodiment, the method can further include sampling SEM images from the transition area(s) for fine tuning of the outer limit, wherein the SEM images correspond to the locations of critical structures. Note that this sampling can be random or user-specified. In one embodiment, the sampling is biased based on defect density. For example, the sampling can include a multi-level sampling based on at least two defect density ranges.

BRIEF DESCRIPTION OF THE DRAWINGS

FIG. 2 illustrates a representation of a processed wafer with defects indicated.

FIG. 3 illustrates an exemplary grouping of defect patterns and an associated pareto chart.

DETAILED DESCRIPTION OF THE DRAWINGS

Matching performance among various scanners is important to operate in similar process window, thereby ensuring repeated, accurate printability of structures on semiconductor wafers. In one embodiment, multiple scanners can be matched using design data associated with and defect data from modulated wafers.

Figure 1:
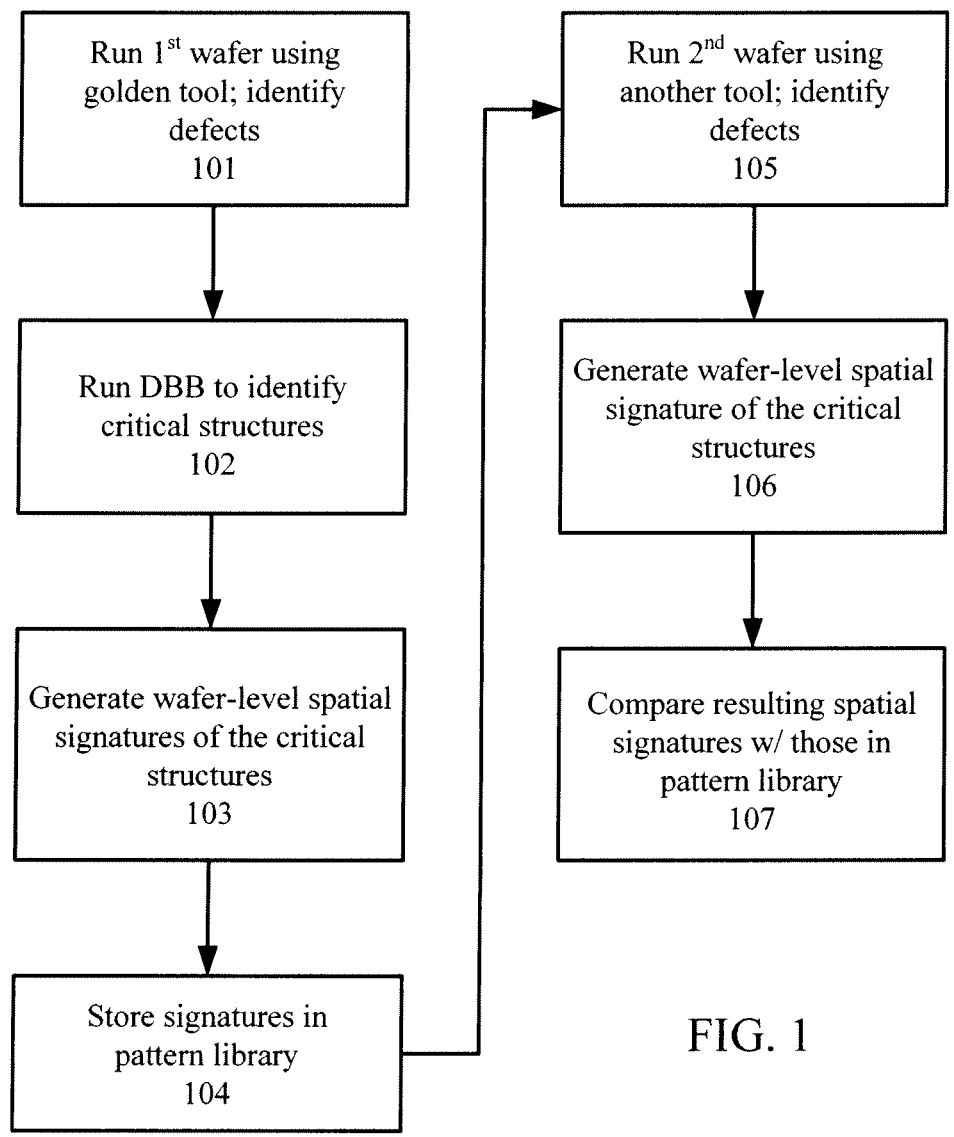
FIG. 1 illustrates an exemplary technique for matching and/or monitoring scanners.

FIG. 1 illustrates an exemplary technique 100 for scanner matching. Step 101 can pattern a first wafer using a "golden tool". A golden tool is a tool already identified as being of appropriate quality for production use. In technique 100, this golden tool can be characterized as a reference tool.

The wafer can be patterned by passing light or other radiation through a mask or reticle to expose a photoresist surface on the wafer. Note that the mask used for this patterning can be either a test mask or a production mask; however, only one mask should be used for steps 101-107.

FIG. 2 illustrates a representation of a wafer 200 having a plurality of dies (shown as squares). Typically, a wafer can include hundreds or even thousands of dies, depending on the die and wafer size. For simplicity, wafer 200 has only a small number of die.

Notably, with regard to step 101, the first wafer is either a FEM or PWQ wafer. A FEM (focus-exposure modulation) wafer has been processed by modulating both frequency and exposure across the wafer. Specifically, each die of the FEM wafer can have an incrementally different exposure and/or focus than any of its surrounding dies. The modulation of the FEM wafer is done in a radial manner. A PWQ (process window qualification) wafer is patterned using similar modulation variation, but in a columnar (not radial) manner. As used herein, the term "modulated" wafer can refer to either a FEM or PWQ wafer. Technique 100 uses only one type of modulated wafer, i.e. either FEM or PWQ wafers, for analysis. For ease of reference, the first wafer is also called the golden wafer.

After running the golden wafer, step 101 can then identify any defects on the golden wafer. For example, FIG. 2 shows defect locations 201 marked as spots on wafer 200. Note that a conventional inspection tool can identify such defect locations.

At this point, a design layout can be used to determine the layout patterns associated with defect locations 201. Layout patterns having substantially the same structures can be grouped together in a bin. This grouping, called design-based binning (DBB) can be performed in step 102. Note that the bigger the pattern, the more noise potentially present. Therefore, in one embodiment, the pattern scope can be defined by structures of 1 micron or smaller.

FIG. 3 illustrates exemplary bins 301, 302, 303, and 304, each bin associated with a specific IC layout pattern. A pareto chart 300 can be formed using the defect and design data from bins 301-304. Pareto chart 300 has bars that represent the defect frequency for each of bins 301-304 (in descending order), i.e. bin 303 has the highest defect frequency, bin 301 the next highest defect frequency, etc. Pareto chart 300 also has a line representing a cumulative total. In this case, the patterns associated with bins 301-304 represent all the defects (100%).

Note that defects can include severe defects that may cause device malfunction or significantly impair device performance. Exemplary severe defects can include shorts and/or opens. Defects can also include marginal defects that may cause minimal or negligible device performance degradation. Exemplary marginal defects can include line deformation, thickening, or thinning.

In one embodiment, one or more SEM images of the defect locations can be associated with each of bins 301-304, thereby allowing a user to designate which of these patterns are "critical" structures. For example, a user may characterize the defects associated with bin 303 to be noise after review of the SEM images of actual, sampled defect locations. Therefore, bin 303 may not be characterized as having critical structures even though having the highest defect frequency.

Note that DBB can advantageously identify modulation corners. For example, one type of layout pattern may become susceptible to defects or its defects may become more pronounced at a particular modulation (frequency and exposure combination). Note further that even when a bin's defects are characterized as marginal, a user may still characterize that bin as having critical structures. For example, a marginal defect may be process node dependent such that a move to a smaller process node may transform the marginal defect to a severe defect. Therefore, when considering a move to an advanced process node, the user may characterize a bin as including critical structures despite being characterized as marginal defects at the present process node.

Referring back to FIG. 1, step 103 can generate wafer-level spatial signatures based on the identified critical structures. Spatial signatures are the spatial distributions of the critical structures on the wafer. In one embodiment, a spatial signature can indicate the area(s) on the wafer of the critical structures, the pattern(s) formed by those areas, and the types of critical structures. Note that the spatial signatures may be formatted graphically on a wafer representation with color-coded areas indicating different critical structures (e.g. the critical structures of bin 301 being colored red and the critical structures of bins 304 being colored blue (assuming both have been characterized as critical structures)). On the golden tool, the spatial signatures can be collected to form golden signatures. Step 104 can store the golden signatures in a pattern library.

Note that if a FEM wafer is being analyzed, its spatial signatures may present more radial patterns of critical structures than other types of patterns. A PWQ wafer being analyzed may include radial spatial signatures, column-wise patterns, or quadrant patterns. In one embodiment, the golden wafer may have spatial signatures that are layout dependent, irrespective of the modulation pattern used. Note that because the center of any modulated wafer typically represents nominal conditions, more failed structures can be expected at the periphery of the wafer than at the center.

Step 105 can process another modulated wafer using another (second) tool. As indicated above, this processing includes the same mask/reticle and the same type of modulated wafer (i.e. FEM or PWQ). Step 105 can also include identifying defects of the second wafer. Because the critical structures for the golden wafer have already been established, DBB is unnecessary for the second wafer. As a result, by using the pattern library and the defect data from the second wafer, step 106 can directly generate the wafer-level spatial signatures of critical structures on the second wafer.

Figure 4:
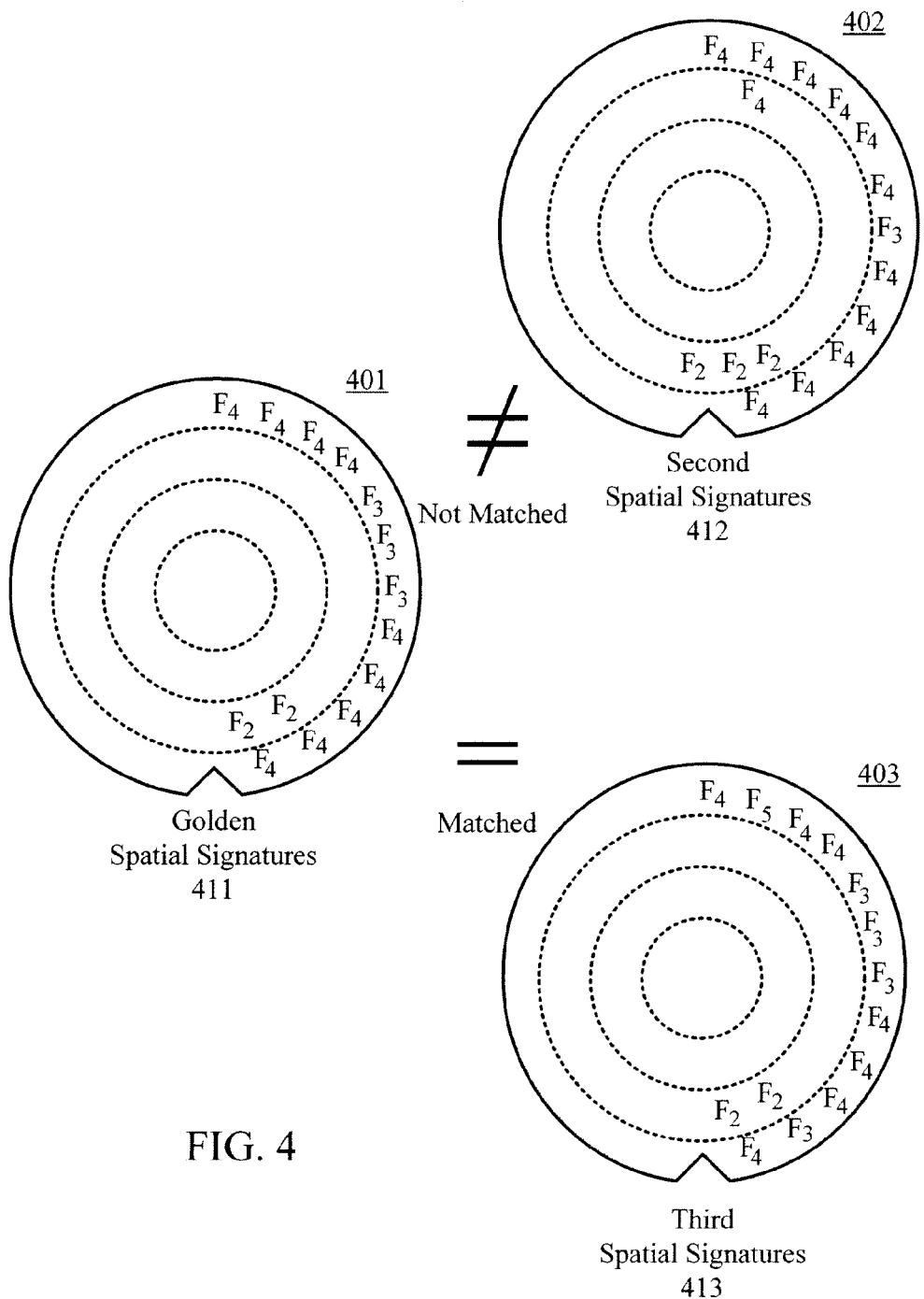
FIG. 4 illustrates comparing the golden spatial signatures to those from two other tools.

In step 107, the resulting spatial signatures from the golden tool and the second tool can be compared. FIG. 4 illustrates an exemplary golden tool 401 having golden spatial signatures and scores 411, a second tool 402 having second spatial signatures and scores 412 and a third tool 403 having third spatial signatures and scores 413. For simplicity, signatures 411, 412, and 413 are locations labeled as "F" (failed). The subscript number represents a score (i.e. the severity of deviation, wherein the greater the deviation, the higher the score) from the intended pattern. As mentioned above, other embodiments can include color-coded areas indicating specific critical structures.

In one embodiment, a user can determine how much variance from golden spatial signatures 411 is allowed for a match condition. In another embodiment, the variance can be automatically set. An exemplary variance could be 10-15% based on scoring or spatial distribution of the pattern variation. The metrics for comparing spatial signatures may involve numerical, radial, quadrant, or other specialized spatial signature analysis. The numerical signature can be a metric showing pattern deviation from either the nominal or intended shape of a pattern from a design. FIG. 4 shows that second spatial signatures 412 do not match golden spatial signatures 411, whereas third spatial signatures 413 to match golden spatial signatures 411.

In one embodiment, the graphical representations of the spatial signatures (such as those shown in FIG. 4) can be generated as outputs for user review. For example, a visual review of spatial signatures 411, 412, and 413 shows that the second tool (which generated second wafer 402) under-performs compared to the golden tool (which generated golden wafer 401), whereas the third tool (which generated third wafer 403) over-performs compared to golden tool. Additionally, because the spatial signatures can indicate critical structures (for example, by color coding), such user review may also result in a better understanding of how selection of the critical structures can affect the performance designation of the non-golden tools.

Figure 5:
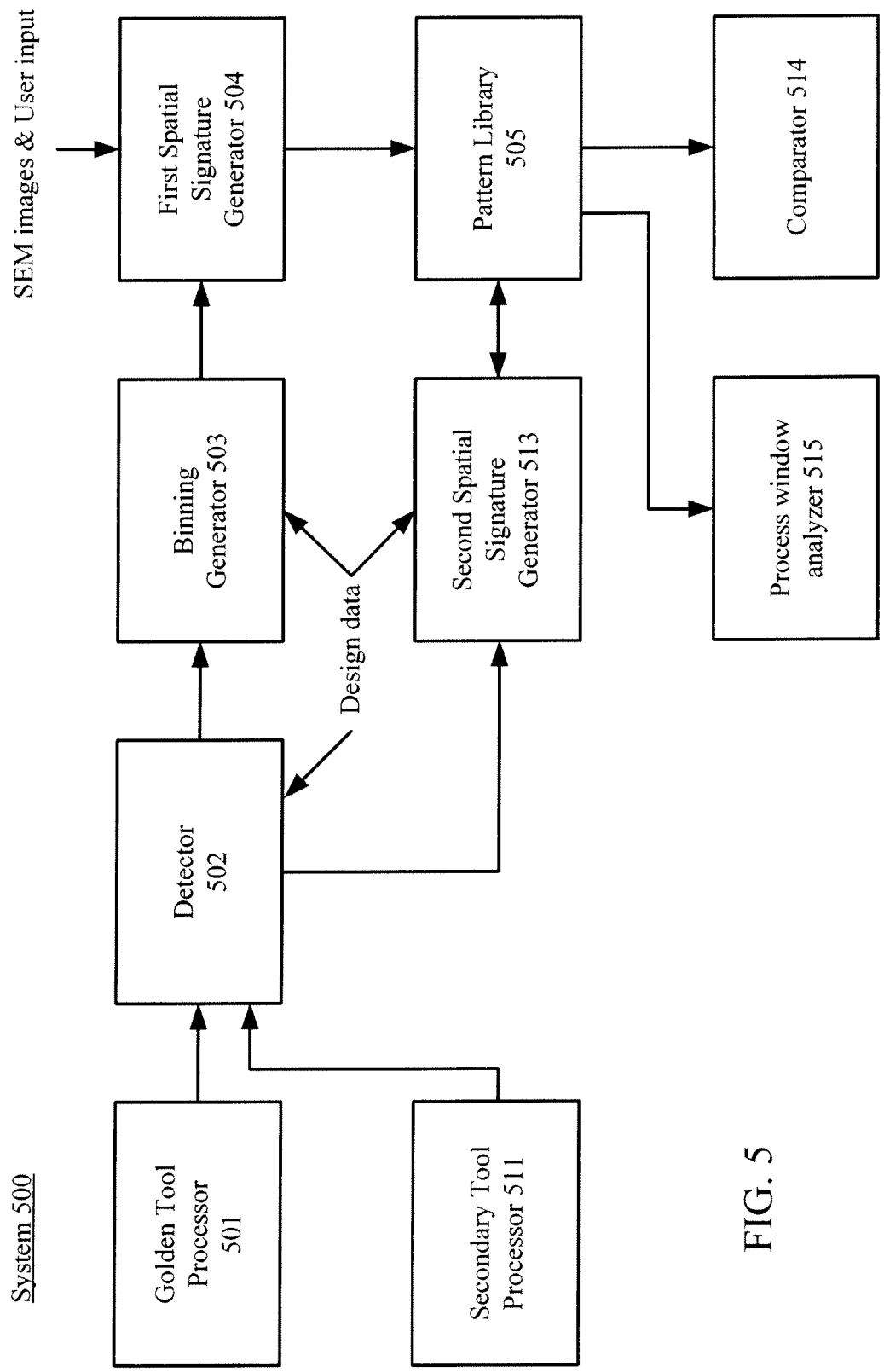
FIG. 5 illustrates an exemplary system for matching and/or monitoring multiple scanners.

FIG. 5 is a block diagram of a system 500 for comparing tools, such as scanners. In this embodiment, system 100 can include a golden tool processor 501 that can process a modulated wafer (FEM or PWQ) using a golden tool (the processed, modulated wafer being the golden wafer). A detector 502 can identify defects on the golden wafer.

A binning generator 503 can use the defect inspection data and design layout data to perform design-based binning (DBB). With select SEM images using samples from pattern groups, a user can use a first spatial signature generator 503 to identify the critical structures. At this point, first signature generator 503 can generate wafer-level spatial signatures of those critical structures. The spatial signatures associated with the golden tool can then be stored in a pattern library 505.

A secondary tool processor 511 can process another modulated (second) wafer using a secondary tool. For secondary tools, the spatial signatures must match within a certain percentage. The metrics may involve certain spatial analysis such as radial, quadrant, or other specialized spatial signature analysis. After defects of the second wafer are identified by detector 502, a second spatial signature generator 512 can generate the spatial signatures on the second wafer using the critical structures defined for the golden wafer (which form part of the golden spatial signatures) and the design layout data. In one embodiment, the second spatial signatures generated associated with the secondary tool can also be stored in pattern library 505. A comparator 514 can compare the spatial signatures associated with the golden tool and the secondary tool.

In this configuration, system 500 can efficiently evaluate the behavior of multiple tools. Note that system 500 can also monitor the performance of a single tool over time. That is, a second modulated wafer can be processed at a later point in time. The spatial signatures of this second modulated wafer can be compared to the spatial signatures of an earlier modulated wafer using the same tool. This comparison can determine whether and to what degree the tool is degrading.

Wafer-level spatial signatures for modulated wafers generated by multiple tools can significantly improve tool matching and tool monitoring capabilities compared to standard practice. Specifically, a standard scanner matching technique uses limited sampling at fixed sites Thus, the standard scanner matching technique is limited to the quality of the pattern selection and metrology sampling. In contrast, design-based binning (DBB) can facilitate the efficient generation of the wafer-level spatial signatures. These wafer-level spatial signatures include wider area coverage across the wafer with additional pattern types, which is particularly critical for the evaluation of cutting edge tools (such as EUV tools).

Figure 6:
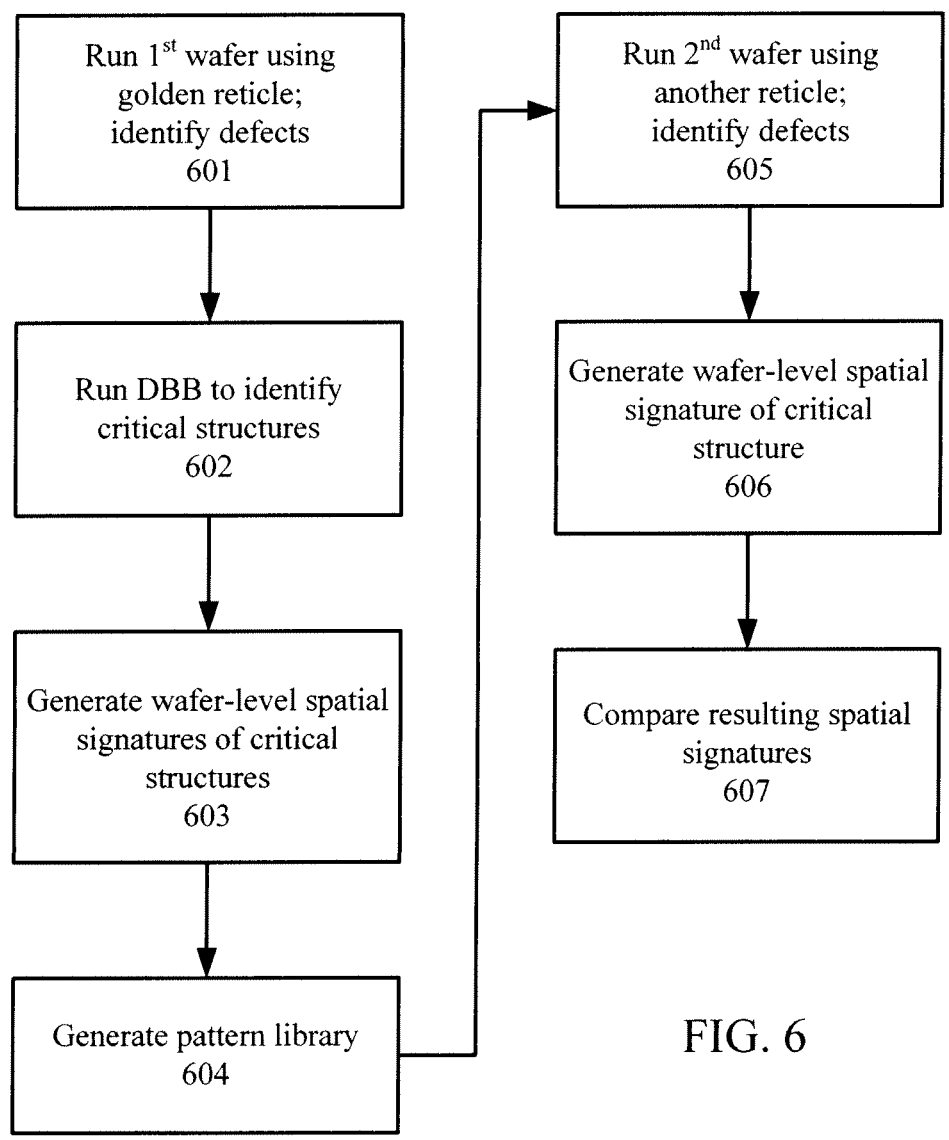
FIG. 6 illustrates an exemplary technique for matching and/or monitoring reticles.

Notably, generating wafer-level spatial signatures can also be performed for reticle comparison (noting that the terms "reticle" and "mask" are interchangeable as used herein). For example, FIG. 6 illustrates an exemplary technique 600 for reticle matching. Step 601 can pattern a first wafer using a "golden reticle". A golden reticle is a reticle already identified as being of appropriate quality for production use. In technique 600, this golden reticle can be characterized as a reference reticle. This first wafer is a modulated wafer, e.g. PWQ or FEM. Note that only one scanner should be used for steps 601-607. Defects on the patterned wafer can then be identified.

Step 602 can run DBB to identify critical structures. Using these critical structures, wafer-level spatial signatures of the first wafer can be generated in step 603. Step 604 can generate a pattern library of the wafer-level spatial signatures. Step 605 can run a second, modulated wafer using another reticle. In one embodiment, this reticle can be a revision of the golden reticle. In another embodiment, this reticle can be tested for reticle qualification, e.g. as a potential second golden reticle for parallel processing of wafers in a production environment. Using the critical structures identified in step 602, wafer-level spatial signatures of the second wafer can be generated in step 606 and stored in the pattern library. Step 607 can compare the spatial signatures generated by the golden reticle and the second reticle.

Figure 7:
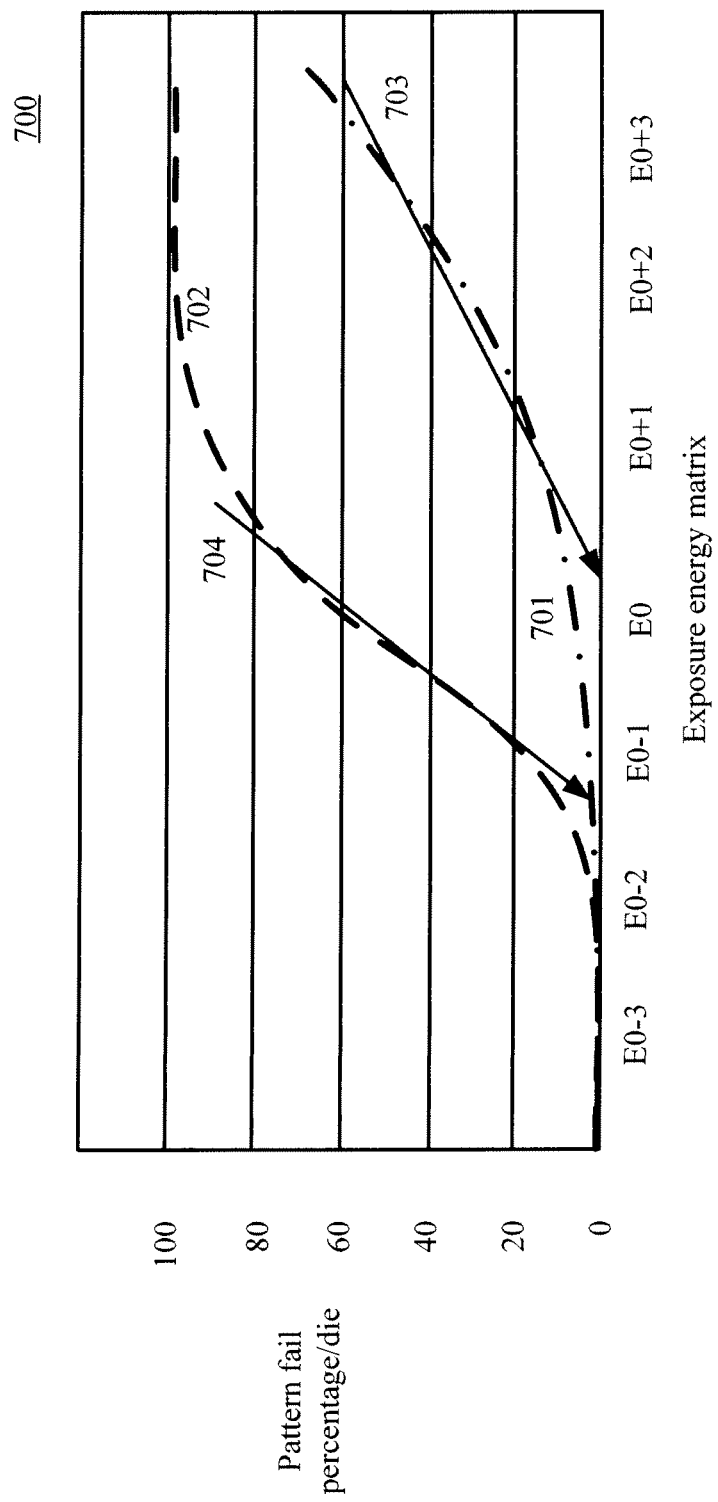
FIG. 7 illustrates a graph plotting pattern fail percentage per die versus the exposure energy matrix for results associated with a golden reticle and a second reticle.

For example, FIG. 7 illustrates a graph 700 plotting pattern fail percentage per die versus the exposure energy matrix for results associated with a golden reticle (curve 701) and a second reticle (curve 702). Note that the pattern fail percentage/die information and exposure energy can be advantageously stored in the pattern library. Graph 700 also shows slopes 703 and 704, which are associated with curves 701 and 702, respectively. Slopes 703 and 704 can be computed as the pattern fail percentage versus the energy change (delta). In FIG. 7, the reticle associated with curve 701 and slope 703 has a slower exposure response and wider window than the reticle associated with curve 702 and slope 704.

Figure 8:
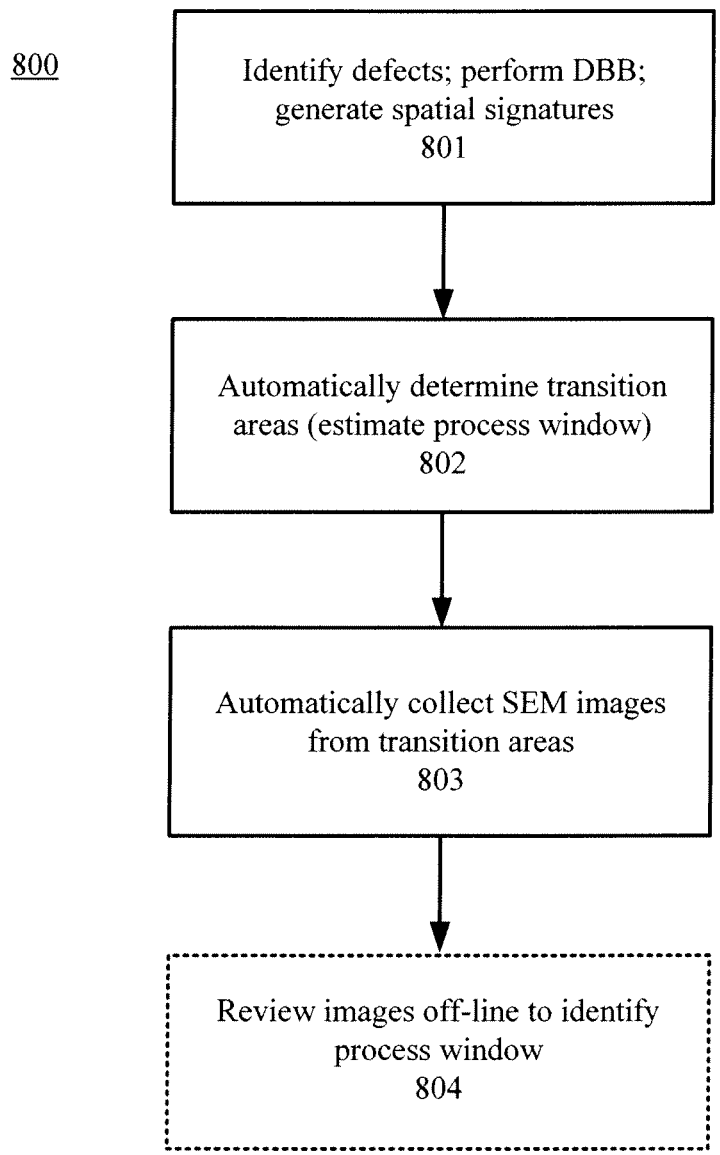
FIG. 8 illustrates an exemplary technique for automatically estimating the process window for a reticle.

In one embodiment shown in FIG. 8, a technique 800 for automatically estimating the process window of a reticle is also provided. As known by those skilled in the art of lithography, a process window defines a region of focus and exposure that keeps a final photoresist profile within specification. In technique 800, step 801 can identify defects on a modulated wafer formed using the reticle, perform DBB, and generate spatial signatures (all described in detail above in reference to FIG. 6). Step 802 can then automatically determine any clean areas, "dirty" areas (i.e. areas having a defect density above a predetermined high threshold), and transition areas (i.e. areas other than clean or dirty areas) on the wafer. Note that the outer limits of the process window will be within one or more transition areas (wherein the process window also includes the clean area). Further note that the process window is either rectangular or square, as defined by the focus/exposure cells of the modulated wafer, which is well known to those skilled in the art of lithography. At this point, step 803 can automatically collect SEM images from those transition areas.

To implement this functionality, a process window analyzer 515 in system 500 (FIG. 5) can use the information in pattern library 505 to estimate a process window for one or more wafers. Process window analyzer 515 can also trigger a SEM (not shown) to capture images in the transition area(s). In one embodiment, the sampling can be random. In another embodiment, the sampling can be directed to specific locations in the transition area(s).

In one embodiment, process window analyzer 515 can formulate a distribution, i.e. a biasing, of samples to collect. For example, a biasing can be formulated based on the defect density, wherein transition areas having more defects should have more SEM images collected than transition areas having fewer defects. Note that process window analyzer 515 can designate any number of sampling levels for the transition areas.

Figure 9:
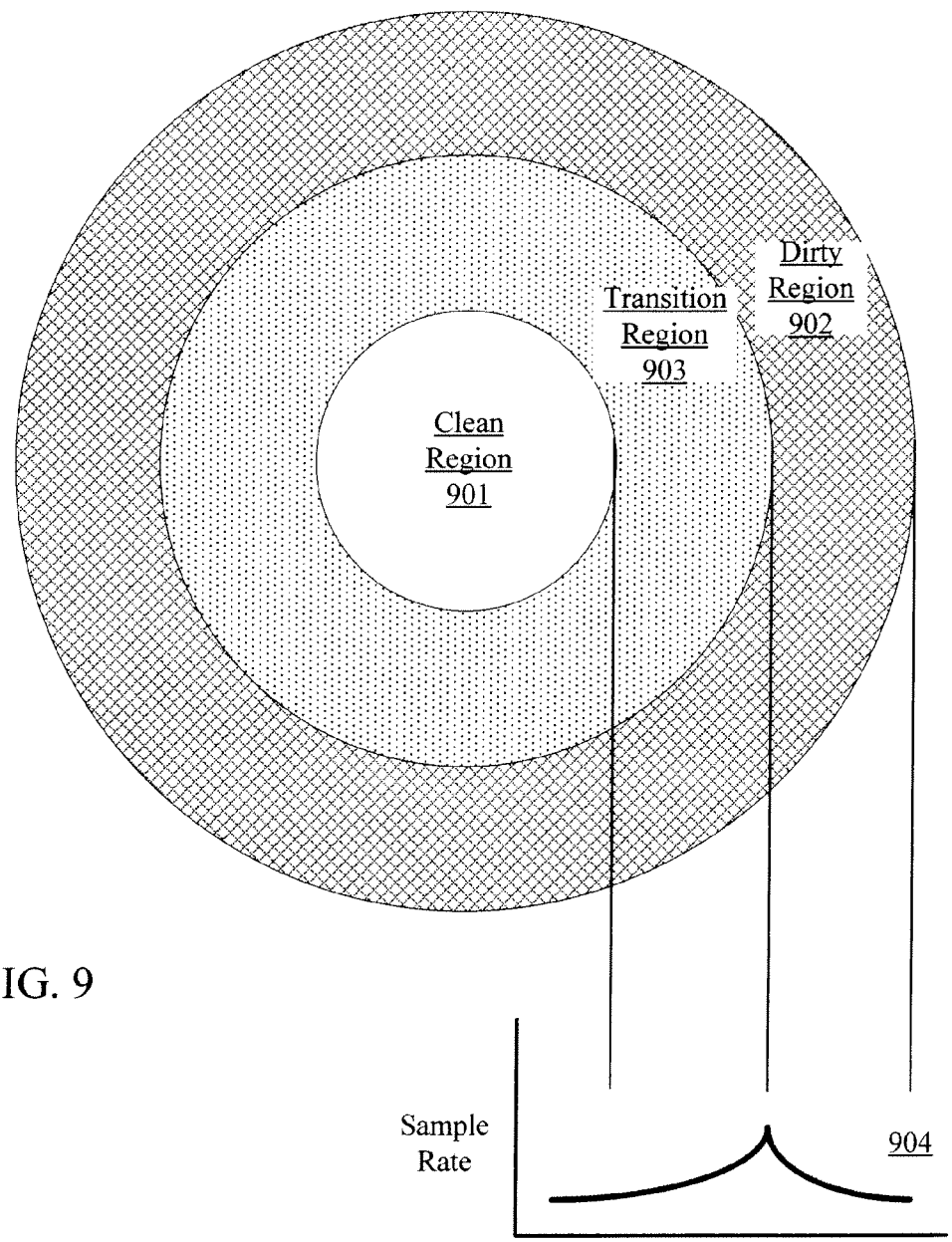
FIG. 9 illustrates a wafer with designated clean, dirty, and transition regions.

FIG. 9 illustrates a wafer 900 with designated clean (901), dirty (902), and transition (903) regions. Note that although these regions are shown as radial, other wafers may have different defect density region borders (e.g. square, rectangular, irregular) and more than one region for a specific defect density. In one embodiment, the defect density can be calculated based on each shot using all defect data. The shots can be ranked based on the density to identify the regions where the defect density starts to increase, i.e. transition region 903. Based on the transition region, defect sampling can be biased where more defects can be sampled near the transition region. For example, graph 904 indicates a variable sampling rate that can be used for clean region 901, transition region 903, and dirty region 902. In one embodiment, a user can override the automatic sampling levels designated for the defect density regions by process window analyzer 515.

Referring back to FIG. 8, a user can review the collected SEM images and then identify the process window offline in step 804. Thus, technique 800 can objectively provide a rough process window, which can then be adjusted based on user analysis. Technique 800 can advantageously replace a manual review process, thereby saving user review time and reducing user subjectivity.

The signature and pattern generators described above can be implemented in a programmable system including at least one programmable processor coupled to receive data and instructions from, and to transmit data and instructions to, a data storage system, at least one input device, and at least one output device. Each computer program for running on the programmable system can be implemented in a high-level procedural or object-oriented programming language or in assembly or machine language if desired; and in any case, the language can be a compiled or interpreted language. Suitable processors include, by way of example, both general and special purpose microprocessors, as well as other types of microcontrollers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

In the interest of clarity, not all features of an actual implementation are described above. It will be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. For example, although embodiments including scanners are described herein, the present invention is equally applicable to steppers as well as any tools capable of modulating focus and exposure. All such modifications and variations are within the scope of the invention as determined by the appended claims when interpreted in accordance with the breadth to which they are fairly, legally, and equitably entitled.

The invention claimed is:

1. A method for comparing scanners, the method comprising:
   processing a golden wafer using a golden tool, the processing including focus and exposure modulation;
   identifying defects on the golden wafer using design data and inspection data;
   binning the defects having similar patterns;
   identifying critical structures by reviewing binned defects;
   generating wafer-level spatial signatures of identified critical structures;
   processing a second wafer using a second tool;
   identifying defects on the second wafer using the design data;
   generating wafer-level spatial signatures of the second wafer using the identified critical structures; and
   comparing the wafer-level spatial signatures of the golden wafer and the second wafer to determine whether the second tool matches the golden tool within an allowable variance, which was set based on at least one of scorings and spatial distributions of the wafer-level spatial signatures of the golden wafer and the second wafer.

2. The method of claim 1, wherein the second tool is the golden tool at a later point in time, thereby allowing monitoring of the golden tool.

3. The method of claim 1, wherein identifying the critical structures includes a user review of SEM images of the defects.

4. The method of claim 1, wherein a wafer-level spatial signature includes at least one of numerical, radial, quadrant, and specialized signatures.

5. A system for comparing scanners, the system comprising:
   a golden tool processor to process a golden wafer using a golden tool, the golden tool processor modulating exposure and focus on the golden wafer;
   a binning generator to receive defect data of the golden wafer and to group defects on the golden wafer into bins based on patterns;
   a first spatial signature generator to generate wafer-level spatial signatures of critical structures of the golden wafer, the critical structures being identified using the patterns;
   a secondary tool processor to process a second wafer using a secondary tool, the secondary tool processor modulating exposure and focus similarly to the golden tool processor;
   a second spatial signature generator to receive defect data of the second wafer and to generate wafer-level spatial signatures of the second wafer using the critical structures; and
   a comparator to compare the wafer-level spatial signatures of the golden wafer and the second wafer, the comparator using an allowable variance, which was set based on at least one of scorings and spatial distributions of the wafer-level spatial signatures of the golden wafer and the second wafer.

6. The system of claim 5, wherein the first spatial signature generator receives SEM images of selected defects.

7. The system of claim 6, wherein the selected defects are automatically selected based on a marginality of predetermined structures under various focus and exposure conditions.

8. The system of claim 5, wherein the first spatial signature generator generates spatial signatures that are at least one of numerical, radial, quadrant, and specialized signatures.

9. The system of claim 5, wherein the second spatial signature generator generates spatial signatures that are at least one of numerical, radial, quadrant, and specialized signatures.

10. A method for comparing reticles, the method comprising:
   processing a golden wafer using a golden reticle, the processing including focus and exposure modulation;
   identifying defects on the golden wafer using design data;
   binning the defects having similar patterns;
   identifying critical structures by reviewing binned defects;
   generating wafer-level spatial signatures of identified critical structures;
   processing a second wafer using a second reticle;
   identifying defects on the second wafer using the design data;
   generating wafer-level spatial signatures of the second wafer using the identified critical structures; and
   comparing the wafer-level spatial signatures of the golden wafer and the second wafer to determine whether the second reticle matches the golden reticle within an allowable variance, which was set based on at least one of scorings and spatial distributions of the wafer-level spatial signatures of the golden wafer and the second wafer.

11. The method of claim 10, wherein identifying the critical structures includes a user review of SEM images of the defects.

12. The method of claim 10, wherein a wafer-level spatial signature includes at least one of numerical, radial, quadrant, and specialized signatures.

* * * * *